(12) United States Patent
Yamada et al.

(10) Patent No.: US 11,760,833 B2
(45) Date of Patent: Sep. 19, 2023

(54) LIQUID COMPOSITION, METALLIC LUSTER FILM, AND ARTICLE

(71) Applicants: FUJIFILM Business Innovation Corp., Tokyo (JP); National University Corporation Chiba University, Chiba (JP)

(72) Inventors: Wataru Yamada, Kanagawa (JP); Satoya Sugiura, Kanagawa (JP); Natsumi Kaneko, Kanagawa (JP); Katsuyoshi Hoshino, Chiba (JP)

(73) Assignees: FUJIFILM BUSINESS INNOVATION CORP., Tokyo (JP); NATIONAL UNIVERSITY CORPORATION CHIBA UNIVERSITY, Chiba (JP)

( * ) Notice: Subject to any disclaimer, the term of this patent is extended or adjusted under 35 U.S.C. 154(b) by 0 days.

(21) Appl. No.: 17/487,686

(22) Filed: Sep. 28, 2021

(65) Prior Publication Data

US 2022/0127415 A1    Apr. 28, 2022

(30) Foreign Application Priority Data

Oct. 22, 2020  (JP) .................................. 2020-177527

(51) Int. Cl.
    *C08G 61/12*     (2006.01)
    *C03C 17/32*     (2006.01)
    *C03C 17/44*     (2006.01)

(52) U.S. Cl.
    CPC ............ *C08G 61/126* (2013.01); *C03C 17/32* (2013.01); *C03C 17/44* (2013.01); *B05D 2203/35* (2013.01); *C03C 2217/72* (2013.01); *C08G 2261/141* (2013.01); *C08G 2261/1424* (2013.01); *C08G 2261/3223* (2013.01); *C08G 2261/36* (2013.01); *C08G 2261/43* (2013.01); *C08G 2261/71* (2013.01); *C08G 2261/90* (2013.01)

(58) Field of Classification Search
    CPC ........ C09D 181/02; B05D 5/067; B05D 5/04; B05D 2203/35; C03C 17/009; C03C 17/32; C03C 17/44; C03C 2217/72; C08G 61/126; C08G 2261/1412; C08G 2261/1424; C08G 2261/3223; C08G 2261/43; C08G 2261/792; C08K 3/16; C08K 3/24
    See application file for complete search history.

(56) References Cited

U.S. PATENT DOCUMENTS

| | | | |
|---|---|---|---|
| 5,354,613 A * | 10/1994 | Quintens | H01B 1/12 428/419 |
| 10,392,529 B2 | 8/2019 | Hoshino et al. | |
| 11,091,668 B2 | 8/2021 | Hoshino et al. | |
| 2011/0001720 A1* | 1/2011 | Asai | H01B 1/127 178/18.05 |
| 2011/0135939 A1* | 6/2011 | Isaji | C09D 163/00 428/428 |
| 2019/0338162 A1* | 11/2019 | Hoshino | C03C 17/44 |

FOREIGN PATENT DOCUMENTS

| | | |
|---|---|---|
| EP | 2309524 A1 | 4/2011 |
| EP | 2399958 A1 | 12/2011 |
| JP | H08-201978 A | 8/1996 |
| JP | 2008-115216 A | 5/2008 |
| JP | 5026054 B2 | 9/2012 |
| JP | 6031197 B2 | 11/2016 |
| JP | 2017-52856 A | 3/2017 |
| JP | 2017-110232 A | 6/2017 |
| JP | 2018-12831 A | 1/2018 |
| JP | 6308624 B2 | 4/2018 |
| JP | 2018-172616 A | 11/2018 |
| WO | 2006/096550 A2 | 9/2006 |
| WO | 2015/056591 A1 | 4/2015 |

OTHER PUBLICATIONS

May 16, 2022 Extended European Search Report issued in Patent Application No. 21201158.9.

* cited by examiner

*Primary Examiner* — Shane Fang
(74) *Attorney, Agent, or Firm* — Oliff PLC

(57) ABSTRACT

A liquid composition includes a thiophene polymer; and at least one polymerization component selected from the group including a monomer and an oligomer.

10 Claims, No Drawings

LIQUID COMPOSITION, METALLIC LUSTER FILM, AND ARTICLE

CROSS-REFERENCE TO RELATED APPLICATIONS

This application is based on and claims priority under 35 USC 119 from Japanese Patent Application No. 2020-177527 filed Oct. 22, 2020.

BACKGROUND

(i) Technical Field

The present disclosure relates to a liquid composition, a metallic luster film, and an article.

(ii) Related Art

Japanese Unexamined Patent Publication Application No. 2017-052856 discloses a method for producing a metallic luster film composed of a thiophene polymer by electrolytically polymerizing a thiophene monomer on a conductive material using a potential sweep method, Japanese Unexamined Patent Publication Application No. 2017-110232 discloses a film having metallic luster and containing a thiophene polymer.

Japanese Patent No. 6031197 discloses a coating solution for forming a metallic-tone coating film containing polythiophene doped with chloride ions or perchlorate ions.

Japanese Patent No. 6308624 discloses a film with a gold-colored luster or copper-colored luster, which contains a thiophene polymer doped with at least one of a perchlorate ion, a hexafluorophosphate ion, a tetrafluoroborate ion, a chloride ion, and a paratoluenesulfonate ions.

Japanese Unexamined Patent Publication Application No. 2018-012831 discloses a solution for producing an article with metallic luster, which contains at least any one of a polyester resin, a polycarbonate resin, a polyvinylpyrrolidone resin, a polystyrene resin, a polymethyl methacrylate resin, and a styrene-acrylic copolymer resin, a thiophene polymer, and a solvent.

SUMMARY

A liquid composition containing a thiophene polymer, a resin, and a solvent may have poor ink jet ejection property. On the other hand, a metallic luster film formed by using a liquid composition containing only a thiophene polymer and a solvent may have poor scratch resistance.

Aspects of non-limiting embodiments of the present disclosure relate to a liquid composition which has excellent ink jet ejection property as compared with a liquid composition containing a thiophene polymer, a resin, and a solvent, and which causes excellent scratch resistance of a formed metallic luster film as compared with a liquid composition containing only a thiophene polymer and a solvent.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a liquid composition containing a thiophene polymer and at least one polymerization component selected from the group including a monomer and an oligomer.

DETAILED DESCRIPTION

An exemplary embodiment of the present disclosure is described below. The description and examples are illustrative of the exemplary embodiment, and do not limit the scope of the exemplary embodiment.

In the present disclosure, the upper limit value or lower limit value described in one of the numerical ranges stepwisely described may be substituted by the upper limit value or lower limit value of another of the numerical ranges stepwisely described. In addition, the upper limit value or lower limit value of a numerical range described in the present disclosure may be substituted by the value described in an example.

In the present disclosure, the term "process" includes not only an independent process but also a process whose expected purpose is achieved even when the process cannot be clearly discriminated from another process.

In the present disclosure, each of the components may contain plural corresponding materials. In the present disclosure, when plural materials corresponding to each of the components are present in a composition, the mention of the amount of each of the components in the composition represents the total amount of the plural materials present in the composition unless otherwise specified.

<Liquid Composition>

A liquid composition according to an exemplary embodiment of the disclosure contains a thiophene polymer and at least one polymerization component selected from the group including a monomer and an oligomer.

In the exemplary embodiment of the disclosure, an oligomer as a polymerization component has a molecular weight of less than 10,000, preferably less than 5,000, and more preferably less than 3,000. In the exemplary embodiment of the disclosure, the oligomer as a polymerization component preferably has a molecular weight of 500 or more.

The content of a polymer (polymer not corresponding to the oligomer and having a molecular weight of 10000 or more) in the liquid composition according to the exemplary embodiment of the disclosure is preferably less than 30% by mass, more preferably less than 20% by mass, and still more preferably less than 10% by mass, relative to the total solid content of the liquid composition.

The liquid composition according to the exemplary embodiment of the disclosure contains at least one of the monomer and the oligomer as the polymerization component, and thus the viscosity falls within a proper range, thereby causing excellent ink jet ejection property.

In addition, when a metallic luster film containing a thiophene polymer is formed by using the liquid composition according to the exemplary embodiment, the metallic cluster film is a cured film containing a polymer formed by polymerization of the polymerization component, and thus has excellent scratch resistance.

[Thiophene Polymer]

The thiophene polymer is a polymer formed by polymerization of two or more thiophenes. A film containing the thiophene polymer exhibits metallic luster due to reflection of light at a specific wavelength from the thiophene polymer aligned in layers.

The thiophene polymer may be a polymer formed by polymerization of one type of thiophene or a polymer formed by polymerization of plural types of thiophenes. An example of the thiophene polymer according to the exemplary embodiment is a polymer represented by the following general formula.

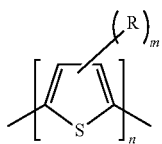

In the general formula, R is a substituent, m is an integer of 1 or 2, and n is an integer of 2 or more. One or plural substituents may be present as R. When m is 2, two Rs possessed by one thiophene ring may be the same or different. When m is 2, two Rs in one thiophene ring may be linked together to form a cyclic group.

For example, R represents an alkoxy group, an alkyl group, an amino group, a hydroxyl group, a hydroxyalkyl group, an aryl group, an allyl group, a cyano group, or a halogeno group. From the viewpoint that a film containing a thiophene polymer more securely exhibits metallic luster, R is preferably an alkoxy group, an alkyl group, an amino group, or a hydroxyl group, more preferably an alkoxy group, an alkyl group, or an amino group, and still more preferably an alkoxy group or an alkyl group.

When R is an alkoxy group, from the viewpoint of the ease of alignment in layers of the thiophene polymer, the number of carbon atoms of the alkoxy group is preferably 1 or more and 8 or less, more preferably 1 or more and 6 or less, still more preferably 1 or more and 4 or less, and particularly preferably 1 or 2.

Examples of thiophenes having at least one alkoxy group include 3-methoxythiophene, 3,4-dimethoxythiophene, 3-ethoxythiophene, 3,4-diethoxythiophene, 3-propoxythiophene, 3-butoxythiophene, 3,4-ethylenedioxythiophene, 3,4-propylenedioxythiophene, and the like.

When R is an alkyl group, from the viewpoint of the ease of alignment in layers of the thiophene polymer, the number of carbon atoms of the alkyl group is preferably 1 or more and 12 or less, more preferably 1 or more and 8 or less, still more preferably 1 or more and 6 or less, even still more preferably 1 or more and 4 or less, and particularly preferably 1 or 2.

Examples of thiophenes having at least one alkyl group include 3-methylthiophene, 3,4-dimethylthiophene, 3-ethylthiophene, 3,4-diethylthiophene, 3-butylthiophene, 3-hexylthiophene, 3-heptylthiophene, 3-octylthiophene, 3-nonylthiophene, 3-decylthiophene, 3-undecylthiophene, 3-dodecylthiophene, 3-bromo-4-methylthiophene, and the like.

When R is an amino group, the amino group may be a primary amino group (—$NH_2$), a secondary amino group (—$NHR^1$, $R^1$ is an alkyl group or an aryl group, preferably an alkyl group), or a tertiary amino group (—$NR^1R^2$, $R^1$ and $R^2$ are each independently an alkyl group or an aryl group, preferably an alkyl group). From the viewpoint of the ease of alignment in layers of the thiophene polymer, the number of carbon atoms of the alkyl group in the secondary amino group or tertiary amino group is preferably 1 or 2.

Examples of a thiophene having at least one amino group include 3-aminothiophene, 3,4-diaminothiophene, 3-methylaminothiophene, 3-dimethylaminothiophene, and the like.

From the viewpoint that a film containing the thiophene polymer more securely exhibits metallic luster, the thiophene polymer is preferably a polymer produced by polymerization of at least one selected from the group including alkoxythiophene, alkylthiophene, aminothiophene, and hydroxythiophene, more preferably a polymer produced by polymerization of at least one selected from the group including alkoxythiophene and alkylthiophene, and still more preferably poly(alkoxythiophene) produced by polymerization of only alkoxythiophene, poly(alkylthiophene) produced by polymerization of only alkylthiophene, or poly(alkylthiophene) (alkoxythiophene) produced by polymerization of only alkylthiophene and alkoxythiophene. The number of carbon atoms of the alkoxy group in alkoxythiophene is preferably 1 or more and 8 or less, more preferably 1 or more and 6 or less, still more preferably 1 or more and 4 or less, and particularly preferably 1 or 2. The number of carbon atoms of the alkyl group in alkylthiophene is preferably 1 or more and 12 or less, more preferably 1 or more and 8 or less, still more preferably 1 or more and 6 or less, even still more preferably 1 or more and 4 or less, and particularly preferably 1 or 2.

From the viewpoint that the thiophene polymer is easily aligned in layers, the weight-average molecular weight of the thiophene polymer is preferably 200 or more and 30,000 or less, more preferably 500 or more and 20,000 or less, and still more preferably 1,000 or more and 10,000 or less.

The molecular weight of the thiophene polymer is measured by gel permeation chromatography (GPC). In the measurement, HPLC 1100 manufactured by Tosoh Corporation is used as a measurement apparatus, two columns of TSKgel GMHHR-M (inner diameter: 7.8 mm, length: 30 cm) manufactured by Tosoh Corporation are arranged in series and used as a column, chloroform is used as a solvent, and monodisperse polystyrene is used as a standard sample.

The content of the thiophene polymer in the liquid composition according to the exemplary embodiment relative to the total solid content of the liquid composition is preferably 0.1% by mass or more and 99.9% by mass or less, more preferably 0.5% by mass or more and 99% by mass or less, and still more preferably 10% by mass or more and 95% by mass or less.

The thiophene polymer is synthesized by, for example, an oxidative polymerization method. The oxidative polymerization method is a method of polymerizing thiophene in a liquid phase or solid phase using an oxidizer.

Examples of the oxidizer include ferric salts, cupric salts, cerium salts, dichromate salts, permanganate salts, ammonium persulfate, boron trifluoride, bromate salts, hydrogen peroxide, chlorine, bromine, and iodine.

The oxidizer is preferably a ferric salt, and a ferric salt may be a hydrate.

Examples of counter ions of ferric salts include chloride ions, citrate ions, oxalate ions, paratoluenesulfonate ions, perchlorate ions, hexafluorophosphate ions, tetrafluoroborate ions, and the like. When at least one of perchlorate ion, hexafluorophosphate ion, and tetrafluoroborate ion is used as the counter ion of a ferric salt, a film having luster close to gold can be formed.

When the oxidizer having a perchlorate ion, a hexafluorophosphate ion, a tetrafluoroborate ion, or a chloride ion as a counter ion is used, the counter ion is stably bonded to the thiophene polymer and remains, and thus a metallic luster state can be stably maintained.

The oxidative polymerization is preferably performed in a solvent. The solvent is preferably a solvent which dissolves the thiophenes and the oxidizer and which causes efficient polymerization of the thiophene. The solvent is preferably an organic solvent having high polarity and some degree of volatility.

Examples of the solvent include acetonitrile, nitromethane, γ-butyrolactone, propylene carbonate, N-methylpyrrolidone, dimethylformamide, dimethylsulfoxide, 1-methyl-2-pyrrolidinone, 2-butanone, tetrahydrofuran, acetone, methanol, anisole, chloroform, ethyl acetate, hexane, trichloroethylene, cyclohexanone, dichloromethane, ethanol, butanol, pyridine, dioxane, and a mixture thereof.

From the viewpoint that a film containing the thiophene polymer more securely exhibits metallic luster, the solvent is preferably an aprotic polar solvent and more preferably at least one selected from the group including acetonitrile, nitromethane, γ-butyrolactone, propylene carbonate, N-methylpyrrolidone, dimethylformamide, and dimethylsulfoxide.

The mass ratio of the solvent to thiophene is preferably solvent:thiophene=1:0.00007 to 1:7 and more preferably 1:0.0007 to 1:0.7.

For example, when the oxidizer is iron(III) perchlorate n-hydrate [reagent grade], the mass ratio of the solvent to oxidizer is preferably solvent:iron(III) perchlorate n-hydrate [reagent grade]=1:0.0006 to 1:6 and more preferably 1:0.006 to 1:0.6.

The mass ratio of the thiophene to oxidizer is preferably thiophene:oxidizer=1:0.1 to 1:1000 and more preferably 1:1 to 1:100.

The oxidative polymerization method is not particularly limited. The oxidative polymerization may be performed by adding and dissolving the thiophene and the oxidizer at a time in a solvent, or the oxidative polymerization may be performed by separately preparing a solution by dissolving the thiophene in a solvent and a solution by dissolving the oxidizer in a solvent and then mixing both solutions.

The molecular weight of the thiophene polymer can be adjusted by changing the thiophene concentration, the reaction temperature, and the reaction time of the oxidative polymerization.

The thiophene polymer synthesized by the oxidative polymerization method may be used directly as a solution or used as a powdery thiophene polymer after removal of the solvent.

The powdery thiophene polymer may contain impurities derived from the oxidizer used for oxidative polymerization. For the purpose of removing the impurities, at least one of treatments (a), (b), and (C) described below may be performed.
(a) The thiophene polymer is washed with a poor solvent.
(b) A solution prepared by dissolving the thiophene polymer in a good solvent is dropped in a poor solvent to precipitate the thiophene polymer.
(c) A poor solvent is dropped in a solution prepared by dissolving the thiophene polymer in a good solvent to precipitate the thiophene polymer.

The poor solvent is an alcohol such as preferably methanol, ethanol, isopropanol, or the like, and the good solvent is preferably dimethylformamide, dimethylsulfoxide, tetrahydrofuran, or the like.

The method for synthesizing the thiophene polymer may be an electrolytic polymerization method. The thiophene polymer produced by the electrolytic polymerization method can be dissolved in a solvent and used in an exemplary embodiment of the disclosure.

The electrolytic polymerization method represents a method in which a monomer is electro-oxidized in an electrolytic solution, prepared by dissolving the monomer in a solvent containing a supporting electrolyte, thereby forming a film composed of an insoluble polymer on a conductive material.

The solvent used in electrolytic polymerization is, for example, water, an alcohol, or a mixed solvent thereof. Also, the solvent described in "Electrochemical Measurement Methods First volume" pp. 107-114 (Akira Fujishima, Masuo Aizawa, Toru Inoue, Gihodo-Shuppan, 1984) may be used.

The supporting electrolyte is preferably an electrolyte which is sufficiently dissolved in a solvent and is hardly electrolyzed. When focusing on cation, the supporting electrolyte is preferably a lithium salt, a sodium salt, a potassium salt, a calcium salt, or a tetraalkylammonium salt, while when focusing on anion, the supporting electrolyte is preferably a halide, a sulfate salt, a nitrate salt, a phosphate salt, a perchlorate salt, a boron trifluoride salt, or a hexafluorophosphate salt.

The concentration of thiophene in the electrolytic solution is preferably 0.1 mmol/L or more and solubility or less and more preferably 1 mmol/L or more and 1 mol/L or less.

The concentration of the supporting electrolyte in the electrolytic solution is preferably 0.001 mol/L or more and solubility or less and more preferably 0.01 mol/L or more and 1 mol/L or less.

The electrolytic polymerization method is preferably a three-electrode type using s conductive material functioned as a working electrode, a counter electrode, and a reference electrode serving as a reference potential, or a two-electrode type using a conductive material functioned as a working electrode and a counter electrode. The three-electrode type is preferred from the viewpoint that the desired thiophene polymer can be polymerized with high reproducibility.

In any one of the three-electrode type and the two-electrode type, the material of the conductor functioned as the working electrode is preferably a material which is stable against electro-oxidation. For example, an electrode (a transparent glass electrode, a metal electrode, a glassy carbon electrode, or the like) coated with a conductive film of indium tin oxide, tin oxide, or the like is preferred. The counter electrode is preferably the electrode described above, a metal electrode of stainless, a copper plate, or the like. The reference electrode is preferably an Ag/AgCl electrode or a saturated calomel electrode.

In the electrolytic polymerization method, anodic oxidation is performed by using a potential sweep method. The potential sweep method represents a treatment of applying a potential while changing the potential at a constant rate.

In the potential sweep method, the potential is preferably swept between a negative potential and a positive potential. In this case, the negative potential is preferably within a range of −1.5 V or more and −0.01 V or less, more preferably within a range of −1.0 V or more and −0.1 V or less, and still more preferably within a range of −0.7 V or more and −0.2 V or less. The positive potential is preferably within a range of +1.0 V or more and +3.0 V or less, more preferably within a range of +1.0 V or more and +2.0 V or less, and still more preferably within a range of +1.0 V or more and +1.5 V or less.

The sweep rate of the potential sweep method is preferably within a range of 0.1 mV/second or more and 10 V/second or less, more preferably within a range of 1 mV/second or more and 1 V/second or less, and still more preferably within a range of 2 mV/second or more and 300 mV/second or less, The time of electrolytic polymerization is preferably within a range of 1 second or more and 5 hours or less, and more preferably within a range of 10 seconds or more and 1 hour or less.

The electrolysis temperature during electrolytic polymerization is preferably within a range of −20° C. or more 60° C. or less.

During the electrolytic polymerization, electrolysis is reaction in which the component materials in the atmosphere are little involved and is performed at a relatively low potential and thus can be performed in the atmosphere. From the viewpoint of avoiding the possibility of contamination of the formed film with oxidation of impurities in the electrolytic solution, electrolysis is preferably performed in a nitrogen gas or argon gas atmosphere, but there is little concern of contamination. But still, the presence of a large amount of oxygen in the electrolytic solution may influence the electrode reaction, and thus bubbling with inert gas (nitrogen gas or argon gas) is also useful.

[Polymerization Component]

The polymerization component is a chemical material having a polymerizable group and is at least one of monomers and oligomers. Monomers and oligomers may be monofunctional or polyfunctional. The monomers and oligomers may be used alone or in combination of two or more.

A monofunctional monomer is, for example, monofunctional (meth)acrylate. Examples of the monofunctional (meth)acrylate include caprolactone (meth)acrylate, isodecyl (meth)acrylate, isooctyl (meth)acrylate, isomystyl (meth)acrylate, isostearyl (meth)acrylate, 2-ethylhexyl-diglycol di(meth)acrylate, 2-hydroxybutyl (meth)acrylate, 2-(meth)acryloyloxyethyl hexahydrophthalic acid, neopentyl glycol (meth)acrylate benzoate ester, isoamyl (meth)acrylate, lauryl (meth)acrylate, stearyl (meth)acrylate, butoxyethyl (meth)acrylate, ethoxy-diethylene glycol (meth)acrylate, methoxy-triethylene glycol (meth)acrylate, methoxy-polyethylene glycol (meth)acrylate, methoxy dipropylene glycol (meth)acrylate, phenoxyethyl (meth)acrylate, phenoxy-polyethylene glycol (meth)acrylate, nonylphenol ethylene oxide adduct (meth)acrylate, tetrahydrofurfuryl (meth)acrylate, isobornyl (meth)acrylate, 2-hydroxyethyl (meth)acrylate, 2-hydroxypropyl (meth)acrylate, 2-hydroxy-3-phenoxypropyl (meth)acrylate, 2-(meth)acryloyloxyethyl-succinic acid, 2-(meth)acryloyloxyethyl-phthalic acid, 2-(meth)acryloyloxyethyl-2-hydroxyethyl-phthalic acid, and the like. These may be used alone or in combination of two or more. In the present disclosure, "(meth)acryl" represents may be either "acryl" or "methacryl".

A difunctional monomer is, for example, difunctional (meth)acrylate. Examples of the difunctional (meth)acrylate include hydroxypivalic acid neopentyl glycol di(meth)acrylate, alkoxylated hexane diol di(meth)acrylate, polytetramethylene glycol di(meth)acrylate, trimethylolpropane (meth)acrylate benzoate ester, diethylene glycol di(meth)acrylate, triethylene glycol di(meth)acrylate, tetraethylene glycol di(meth)acrylate, polyethylene glycol(200) di(meth)acrylate, polyethylene glycol(400) di(meth)acrylate, polyethylene glycol(600) di(meth)acrylate, neopentyl glycol di(meth)acrylate, 1,3-butylene glycol di(meth)acrylate, 1,4-butanediol di(meth)acrylate, 1,6-hexanediol di(meth)acrylate, 1,9-nonanediol di(meth)acrylate, dimethyloltricyclodecane di(meth)acrylate, bisphenol A di(meth)acrylate, ethoxylated bisphenol A di(meth)acrylate, and the like. These may be used alone or in combination of two or more.

Examples of an oligomer having a polymerizable group include urethane (meth)acrylate, polyester (meth)acrylate, epoxy (meth)acrylate, silicone (meth)acrylate, polybutadiene (meth)acrylate, and the like. These may be used alone or in combination of two or more.

From the viewpoint of accelerating the polymerization reaction for forming a cured film, the polymerization component is preferably polyfunctional. From the viewpoint of accelerating the polymerization reaction for forming a cured film, the polymerization component is preferably a chain-polymerizable polymerization component.

When the liquid composition according to the exemplary embodiment of the disclosure contains, as the polymerization component, a monomer, but does not contain an oligomer, from the viewpoint of excellent scratch resistance of a cured film, the content of the monomer relative to the total solid content of the liquid composition is preferably 30% by mass or more, more preferably 35% by mass or more, and still more preferably 40% by mass or more. When the liquid composition according to the exemplary embodiment of the disclosure contains as the polymerization component a monomer, but does not contain an oligomer, from the viewpoint of ink jet ejection property of the liquid composition, the content of the monomer relative to the total solid content of the liquid composition is preferably 70% by mass or less, more preferably 65% by mass or less, and still more preferably 60% by mass or less.

When the liquid composition according to the exemplary embodiment of the disclosure contains as the polymerization component an oligomer, but does not contain a monomer, from the viewpoint of excellent scratch resistance of a cured film, the content of the oligomer relative to the total solid content of the liquid composition is preferably 20% by mass or more, 25% by mass or more, and still more preferably 30% by mass or more. When the liquid composition according to the exemplary embodiment of the disclosure contains as the polymerization component an oligomer, but does not contain a monomer, from the viewpoint of ink jet ejection property of the liquid composition, the content of the oligomer relative to the total solid content of the liquid composition is preferably 60% by mass or less, more preferably 55% by mass or less, and still more preferably 50% by mass or less.

The content of the polymerization component in the liquid composition according to the exemplary embodiment of the disclosure, relative to the total solid content of the liquid composition, is preferably 20% by mass or more and 70% by mass or less, more preferably 25% by mass or more and 65% by mass or less, and still more preferably 30% by mass or more and 60% by mass or less.

The mass ratio of the thiophene polymer to the polymerization component in the liquid composition according to the exemplary embodiment of the disclosure is preferably thiophene polymer:copolymerization component=1:0.01 to 1:100, more preferably 1:0.05 to 1:50, and still more preferably 1:0.1 to 1:5.

[Polymerization Initiator]

The liquid composition according to the exemplary embodiment of the disclosure preferably contains a polymerization initiator from the viewpoint of accelerating polymerization reaction for forming a cured film.

From the viewpoint of accelerating polymerization reaction for forming a cured film, the polymerization initiator is preferably at least one of a thermal radical generator and an optical radical generator. The polymerization initiators may be used alone or in composition of two or more.

Examples of the thermal radical generator include an azo compound and an organic peroxide.

Examples of the optical radical generator include hydroxyketones, acylphosphine oxides, benzoins, benzylketals, aminoketones, titanocenes, bisimidazoles, aromatic ketones, aromatic onium salts, organic peroxides, thio compounds (a thioxanthone compound, a thiophenyl group-containing compound, and the like), hexaaryl bisimidazole compounds, ketoxime ester compounds, borate compounds, azinium compounds, metallocene compounds, active ester compounds, compounds having a carbon-halogen bond, and alkylamine compounds.

The amount of the polymerization initiator contained in the liquid composition according to the exemplary embodiment of the disclosure may be determined according to the amount of the polymerization component. The amount of the polymerization initiator relative to the total solid content of the liquid composition is preferably 1% by mass or more and 10% by mass or less, more preferably 2% by mass or more and 8% by mass or less, and still more preferably 3% by mass or more and 6% by mass or less.

[Solvent]

From the viewpoint of adjusting the material concentration and viscosity, the liquid composition according to the exemplary embodiment of the disclosure preferably contains a solvent. In the exemplary embodiment of the disclosure, the "solvent" of the liquid composition represents a component which is evaporated in the process of forming a metallic luster film and substantially does not remain in the metallic luster film.

The solvent is preferably a solvent which dissolves at least the thiophene polymer, and examples thereof include acetonitrile, nitromethane, γ-butyrolactone, propylene carbonate, N-methylpyrrolidone, dimethylformamide, dimethylsulfoxide, 1-methyl-2-pyrrolidinone, 2-butanone, tetrahydrofuran, acetone, methanol, anisole, chloroform, ethyl acetate, hexane, trichloroethane, cyclohexanone, dichloromethane, ethanol, butanol, pyridine, dioxane, and a mixture thereof.

From the viewpoint that a film containing the thiophene polymer more securely exhibits metallic luster, an aprotic polar solvent is preferred, and is more preferably at least one selected from the group including acetonitrile, nitromethane, γ-butyrolactone, propylene carbonate, N-methylpyrrolidone, dimethylformamide, and dimethylsulfoxide.

The amount of the solvent contained in the liquid composition according to the exemplary embodiment of the disclosure, relative to the total of the liquid composition, is preferably 0% by mass or more and 99.9% by mass or less, more preferably 1% by mass or more and 99% by mass or less, and still more preferably 5% by mass or more and 95% by mass or less.

The viscosity of the liquid composition according to the exemplary embodiment of the disclosure is preferably 1 mPa·s or more and 30 mPa·s or less and more preferably 2 mPa·s or more and 20 mPa·s or less. The viscosity of the liquid composition according to the exemplary embodiment of the disclosure is measured by using Model TV-20 viscometer (Toki Sangyo Co., Ltd.) as a measurement device under the conditions including a temperature of 23±0.5° C. and a shear rate of $1400 \text{ s}^{-1}$.

[Other Components]

The liquid composition according to the exemplary embodiment of the disclosure may contain various additives. Examples of the additives include a sensitizer, a thermal stabilizer, an antioxidant, an antireductant, a defoaming agent, a penetrant, a leveling agent, a surfactant, a dispersion stabilizer, a viscosity modifier, a pH adjuster, an ultraviolet absorber, an antiseptic agent, an anti-mold agent, and the like.

<Metallic Luster Film>

A metallic luster film according to an exemplary embodiment of the disclosure is a film formed by curing the liquid composition according to the exemplary embodiment. The metallic luster film according to the exemplary embodiment has excellent scratch resistance.

The metallic luster film according to the exemplary embodiment can be formed by, for example, applying the liquid composition according to the exemplary embodiment on an article to form a coating film and then applying at least one of heat and light to the coating film.

An ink jet method is preferred for forming the coating film. The coating film may be formed by using a screen-printing method, an offset printing method, a spin coating method, a bar coating method, a dip coating method, a drop casting method, or the like.

The temperature of heat applied to the coating film or the frequency and intensity of light applied to the coating film is preferably selected according to the type and amount of the polymerization component contained in the liquid composition according to the exemplary embodiment and the type and amount of the polymerization initiator contained in the liquid composition.

From the viewpoint of fixing the metallic luster film on the article after forming the metallic luster film, the metallic luster is preferably pressurized. The pressurization includes rubbing.

The thickness of the metallic luster film is preferably a thickness with which metallic luster is exhibited, and specifically preferably 0.01 μm or more and 200 μm or less.

The weight-average molecular weight of the thiophene polymer contained in the metallic luster film is preferably 200 or more and 30000 or less, more preferably 500 or more and 20000 or less, and still more preferably 1000 or more and 10000 or less.

The molecular weight of the thiophene polymer contained in the metallic luster film is measured by, for example, dissolving the metallic luster film in a solvent and then extracting the thiophene polymer.

<Article>

An article according to an exemplary embodiment of the disclosure has the metallic luster film according to the exemplary embodiment.

The article according to the exemplary embodiment of the disclosure is produced by forming the metallic luster film on an article. Examples of an object article on which the metallic luster film is formed include furniture, building members, toys, miscellaneous goods, clothing, paper products, packages, and the like. However, these are illustrative, and the article is not particularly limited as long as the metallic luster film can be formed. From the viewpoint of easy formation of the metallic luster film, the material of the article is preferably a resin, glass, paper, or the like.

EXAMPLES

The exemplary embodiment of the disclosure is described in further detail below by exemplifying examples, but the exemplary embodiment is not limited to the examples. In addition, "parts" and "%" are on mass basis unless otherwise specified. Synthesis, treatment, production etc. are performed at room temperature (25° C.±3° C.) unless otherwise specified.

Example 1

[Synthesis of Thiophene Polymer]

In a three-neck flask, 11.4 g of 3-methoxythiophene is added, and 0.5 L of acetonitrile is added to dissolve 3-methoxythiophene in acetonitrile. Next, the inside of the three-neck flask is substituted with nitrogen and cooled to 0° C. Next, a solution prepared by dissolving 101 g of iron(III) perchlorate n-hydrate [reagent grade] in 0.5 L of acetonitrile is added dropwise while the solution and the inside of the reaction system are maintained at 5° C. or less. Next, the temperature is increased to room temperature, and then the resultant mixture is stirred at room temperature for 15 hours. Next, 1 L of methanol is added and stirred for 1 hour. Next, a solid content is collected by solid-liquid separation using a centrifugal separator and then dried under reduced pressure at 60° C. for 16 hours, producing 10.5 g of thiophene polymer.

[Methanol Washing]

In a beaker, 2.0 g of the synthesized thiophene polymer is placed, and 50 mL of methanol is added. Then, the liquid temperature is adjusted to 45° C., followed by stirring for 1 hour. Next, a solid content obtained by solid-liquid separation using a centrifugal separator is placed in a beaker, and 50 mL of methanol was added. Then, the liquid temperature is adjusted to 45° C., followed by stirring for 1 hour. Next, a solid content is collected by solid-liquid separation using a centrifugal separator and then dried under reduced pressure at 60° C. for 16 hours, producing 1.8 g of thiophene polymer. The weight-average molecular weight of the thiophene polymer after methanol washing is 3000.

[Preparation of Liquid Composition]

First, 100 mg of the thiophene polymer after methanol washing and 100 mg of ethoxylated bisphenol A diacrylate (product name ABE-300, manufactured by Shin-Nakamura Chemical Co., Ltd.) are dissolved in 10 mL of γ-butyrolactone. Then, 20 mg of thermal radical generator (product name AIBN, manufactured by Otsuka Chemical Co., Ltd., 10-hour half-life temperature: 65° C.) is dissolved in the resultant solution, and the resultant solution is filtered with a membrane filter of 0.45 μm. The filtrate is bubbled with Ar for 30 minutes to remove oxygen, producing a liquid composition.

[Formation of Metallic Luster Film]

The liquid composition is dropped and cast on a washed glass substrate to form a coating film. The glass substrate having the coating film is placed at room temperature for 10 minutes and then placed in a glass-made sealed vessel. The inside of the sealed vessel is substituted by dry Ar until the oxygen concentration in the sealed vessel is 100 ppm ("ppm" is an abbreviation of "parts per million" and the oxygen concentration is on volume basis). Then, the glass substrate is placed at a temperature of 45° C. for 20 minutes and at a temperature of 100° C. for 20 minutes. Thus, the coating film is cured to form a metallic luster film. The thickness of the metallic luster film is about 1.0 μm.

[Formation of Metallic Luster Reference Film]

First, 100 mg of the thiophene polymer after methanol washing is dissolved in 10 mL of γ-butyrolactone. Then, the resultant solution is filtered with a membrane filter of 0.45 μm, producing a thiophene polymer solution. The thiophene polymer solution is dropped and cast on a washed glass substrate to form a coating film. The glass substrate having the coating film is placed at room temperature for 10 minutes and then placed at a temperature of 45° C. for 20 minutes and at a temperature of 100° C. for 20 minutes. Thus, a metallic luster reference film is formed. The thickness of the metallic luster reference film is about 1.0 μm.

Examples 2 to 7

Thiophene polymers having different weight-average molecular weights are synthesized by the same method as in Example 1 except that in synthesizing the thiophene polymer, the concentration of 3-methoxythiophene and the reaction temperature and reaction time are changed. The synthesized thiophene polymers are washed with methanol by the same method as in Example 1. Consequently, each of the thiophene polymers having the weight-average molecular weight described in Table 1 is produced. Then, using the same methods as in Example 1, a liquid composition is prepared and a metallic luster film is formed. Also, using the same methods as in Example 1, a thiophene polymer solution is prepared, and a metallic luster reference film is formed. The thickness of each of the metallic luster film and the metallic luster reference film is about 1.0 μm.

Comparative Example 1

A metallic luster film is formed by the same method as "Formation of metallic luster reference film" in Example 1 using the thiophene polymer synthesized and washed with methanol in Example 1. The thickness of the metallic luster film is about 1.0 μm.

Comparative Example 2

[Preparation of Liquid Composition]

First, 100 mg of the thiophene polymer synthesized and washed with methanol in Example 1 and 100 mg of polyester resin are dissolved in 10 mL of γ-butyrolactone. Then, the resultant solution is filtered with a membrane filter of 0.45 μm, producing a liquid composition.

[Formation of Metallic Luster Film]

The liquid composition is dropped and cast on a washed glass substrate to form a coating film. The glass substrate having the coating film is placed at room temperature for 10 minutes and then placed at a temperature of 45° C. for 20 minutes. Thus, the coating film is dried to form a metallic luster film. The thickness of the metallic luster film is about 1.0 μm.

[Formation of Metallic Luster Reference Film]

A metallic luster reference film is formed by the same method as "Formation of metallic luster reference film" in Example 1. The thickness of the metallic luster reference film is about 1.0 μm.

Example 8

[Preparation of Liquid Composition]

First, 100 mg of the thiophene polymer synthesized and washed with methanol in Example 1, 50 mg of polyethylene glycol diacrylate (produce name SR344, manufactured by Sartomer Japan Inc.), and 50 mg of trifunctional urethane acrylate oligomer (produce name CN929, manufactured by Sartomer Japan Inc.) are dissolved in 10 mL of γ-butyrolactone. Then, 20 mg of optical radical generator (product name Darocur 1173) is dissolved in the resultant solution, and the resultant solution is filtered with a membrane filter of 0.45 μm. The filtrate is bubbled with Ar for 30 minutes to remove oxygen, producing a liquid composition.

[Formation of Metallic Luster Film]

The liquid composition is dropped and cast on a washed glass substrate to form a coating film. The glass substrate having the coating film is placed at room temperature for 10 minutes and then irradiated with ultraviolet light under the following conditions. Thus, the coating film is cured to form a metallic luster film. The thickness of the metallic luster film is about 1.0 μm.

—Ultraviolet Irradiation Conditions—
Type of lamp: metal halide lamp
Illuminance: 200 mW/cm$^2$
Number of times of irradiation: 30
Irradiation height: 5 mm

[Formation of Metallic Luster Reference Film]

A metallic luster reference film is formed by the same method as "Formation of metallic luster reference film" in Example 1. The thickness of the metallic luster reference film is about 1.0 μm.

Example 9

[Preparation of Liquid Composition]

First, 100 mg of the thiophene polymer synthesized and washed with methanol in Example 1, 5 mg of polyethylene glycol diacrylate (manufactured by Sartomer Japan Inc.), and 95 mg of ethoxylated bisphenol A diacrylate are dissolved in 10 mL of γ-butyrolactone. Then, 20 mg of thermal radical generator (product name AIBN, manufactured by Otsuka Chemical Co., Ltd., 10-hour half-life temperature: 65° C.) is dissolved in the resultant solution, and the resultant solution is filtered with a membrane filter of 0.45 μm. The filtrate is bubbled with Ar for 30 minutes to remove oxygen, producing a liquid composition.

[Formation of Metallic Luster Film]

The liquid composition is dropped and cast on a washed glass substrate to form a coating film. The glass substrate having the coating film is placed at room temperature for 10 minutes and then placed in a glass-made sealed vessel. The inside of the sealed vessel is substituted by dry Ar until the oxygen concentration in the sealed vessel is 100 ppm. Then, the glass substrate is placed at a temperature of 45° C. for 20 minutes and at a temperature of 100° C. for 20 minutes. Thus, the coating film is cured to form a metallic luster film. The thickness of the metallic luster film is about 1.0 μm.

[Formation of Metallic Luster Reference Film]

A metallic luster reference film is formed by the same method as "Formation of metallic luster reference film" in Example 1. The thickness of the metallic luster reference film is about 1.0 μm.

Example 10

[Preparation of Liquid Composition]

A liquid composition is prepared by the same mass as "Preparation of liquid composition" in Example 1 except that propylene carbonate is used in place of γ-butyrolactone.

[Formation of Metallic Luster Film]

A metallic luster film is formed by the same method as "Formation of metallic luster film" in Example 1 using the composition prepared as described above. The thickness of the metallic luster film is about 1.0 μm.

[Formation of Metallic Luster Reference Film]

A metallic luster reference film is formed by the same method as "Formation of metallic luster reference film" in Example 1 except that propylene carbonate is used in place of γ-butyrolactone. The thickness of the metallic luster reference film is about 1.0 μm.

Example 11

[Preparation of Liquid Composition]

A liquid composition is prepared by the same mas as "Preparation of liquid composition" in Example 1 except that a mixed solvent of γ-butyrolactone/acetonitrile is used in place of γ-butyrolactone.

[Formation of Metallic Luster Film]

A metallic luster film is formed by the same method as "Formation of metallic luster film" in Example 1 using the composition prepared as described above. The thickness of the metallic luster film is about 1.0 μm.

[Formation of Metallic Luster Reference Film]

A metallic luster reference film is formed by the same method as "Formation of metallic luster reference film" in Example 1 except that a mixed solvent of γ-butyrolactone/acetonitrile is used in place of γ-butyrolactone. The thickness of the metallic luster reference film is about 1.0 μm.

Example 12

[Synthesis of Thiophene Polymer]

In a three-neck flask, 3.1 g of 3-butoxythiophene is added, and 0.1 L of acetonitrile is added to dissolve 3-butoxythiophene in acetonitrile. Next, the inside of the three-neck flask is substituted with nitrogen and cooled to 0° C. Next, a solution prepared by dissolving 20 g of iron(III) perchlorate n-hydrate [reagent grade] in 0.1 L of acetonitrile is added dropwise while the solution and the inside of the reaction system are maintained at 5° C. or less. Next, the temperature is increased to room temperature, and then the resultant mixture is stirred at room temperature for 15 hours. Next, 0.2 L of methanol is added and stirred for 1 hour. Next, a solid content is collected by solid-liquid separation using a centrifugal separator.

[Precipitate Treatment and Methanol Washing]

The collected solid content is dissolved in 100 mL of dimethylformamide. Then, 1 L of isopropyl alcohol is added dropwise to the resultant solution under stirring over 30 minutes, gradually precipitating a solid. Next, the solid content obtained by solid-liquid separation using a centrifugal separator is placed in a beaker, and 50 mL of methanol is added. Then, the liquid temperature is adjusted to 45° C., followed by stirring for 1 hour. Next, a solid content is collected by solid-liquid separation using a centrifugal separator and then dried under reduced pressure at 60° C. for 16 hours, producing 1.9 g of thiophene polymer. The weight-average molecular weight of the thiophene polymer after methanol washing is 3,200.

[Preparation of Liquid Composition]

First, 100 mg of the thiophene polymer after methanol washing and 100 mg of ethoxylated bisphenol A diacrylate (product name ABE-300, manufactured by Shin-Nakamura Chemical Co., Ltd.) are dissolved in 10 mL of γ-butyrolactone. Then, 20 mg of thermal radical generator (product name AIBN, manufactured by Otsuka Chemical Co., Ltd., 10-hour half-life temperature: 65° C.) is dissolved in the resultant solution, and the resultant solution is filtered with a membrane filter of 0.45 μm. The filtrate is bubbled with Ar for 30 minutes to remove oxygen, producing a liquid composition.

[Formation of Metallic Luster Film]

The liquid composition is dropped and cast on a washed glass substrate to form a coating film. The glass substrate having the coating film is placed at room temperature for 10 minutes and then placed in a glass-made sealed vessel. The inside of the sealed vessel substituted by dry Ar until the oxygen concentration in the sealed vessel is 100 ppm. Then, the glass substrate is placed at a temperature of 45° C. for 20 minutes and at a temperature of 100° C. for 20 minutes. Thus, the coating film is cured to form a metallic luster film. The thickness of the metallic luster film is about 1.0 μm.

[Formation of Metallic Luster Reference Film]

First, 100 mg of the thiophene polymer after methanol washing is dissolved in 10 mL of γ-butyrolactone. Then, the resultant solution is filtered with a membrane filter of 0.45 μm, producing a thiophene polymer solution. The thiophene polymer solution is dropped and cast on a washed glass substrate to form a coating film. The glass substrate having the coating film is placed at room temperature for 10 minutes and then placed at a temperature of 45° C. for 20 minutes and at a temperature of 100° C. for 20 minutes. Thus, a metallic luster reference film is formed. The thickness of the metallic luster reference film is about 1.0 μm.

Example 13

[Synthesis of Thiophene Polymer]

In a three-neck flask, 0.02 g of 3-methylthiophene and 2.05 g of 3-methoxythiophene are added, and 0.1 L of acetonitrile is added to dissolve the thiophenes in acetonitrile. Next, the inside of the three-neck flask is substituted by nitrogen and cooled to 0° C. Next, a solution prepared by dissolving 20 g of iron(III) perchlorate n-hydrate [reagent grade] in 0.1 L of acetonitrile is added dropwise while the solution and the inside of the reaction system are maintained at 5° C. or less. Next, the temperature is increased to room temperature, and then the resultant mixture is stirred at room temperature for 15 hours. Next, 0.2 L of methanol is added and stirred for 1 hour. Next, a solid content is collected by solid-liquid separation using a centrifugal separator.

[Precipitate Treatment and Methanol Washing]

The collected solid content is dissolved in 100 mL of dimethylformamide. Then, 1 L of isopropyl alcohol is added dropwise to the resultant solution under stirring over 30 minutes, gradually precipitating a solid. Next, the solid content obtained by solid-liquid separation using a centrifugal separator is placed in a beaker, and 50 mL of methanol is added. Then, the liquid temperature is adjusted to 45° C., followed by stirring for 1 hour. Next, a solid content is collected by solid-liquid separation using a centrifugal separator and then dried under reduced pressure at 60° C. for 16 hours, producing 1.9 g of thiophene polymer. The weight-average molecular weight of the thiophene polymer after methanol washing is 3300.

[Preparation of Liquid Composition]

First, 100 mg of the thiophene polymer after methanol washing and 100 mg of ethoxylated bisphenol A diacrylate (product name ABE-300, manufactured by Shin-Nakamura Chemical Co., Ltd.) are dissolved in 10 mL of γ-butyrolactone. Then, 20 mg of thermal radical generator (product name AIBN, manufactured by Otsuka Chemical Co., Ltd., 10-hour half-life temperature: 65° C.) is dissolved in the resultant solution, and the resultant solution is filtered with a membrane filter of 0.45 μm. The filtrate is bubbled with Ar for 30 minutes to remove oxygen, producing a liquid composition.

[Formation of Metallic Luster Film]

The liquid composition is dropped and cast on a washed glass substrate to form a coating film. The glass substrate having the coating film is placed at room temperature for 10 minutes and then placed in a glass-made sealed vessel. The inside of the sealed vessel substituted by dry Ar until the oxygen concentration in the sealed vessel is 100 ppm. Then, the glass substrate is placed at a temperature of 45° C. for 20 minutes and at a temperature of 100° C. for 20 minutes. Thus, the coating film is cured to form a metallic luster film. The thickness of the metallic luster film is about 1.0 μm.

[Formation of Metallic Luster Reference Film]

First, 100 mg of the thiophene polymer after methanol washing is dissolved in 10 mL of γ-butyrolactone. Then, the resultant solution is filtered with a membrane filter of 0.45 μm, producing a thiophene polymer solution. The thiophene polymer solution is dropped and cast on a washed glass substrate to form a coating film. The glass substrate having the coating film is placed at room temperature for 10 minutes and then placed at a temperature of 45° C. for 20 minutes and at a temperature of 100° C. for 20 minutes. Thus, a metallic luster reference film is formed. The thickness of the metallic luster reference film is about 1.0 μm.

Example 14

[Synthesis of Thiophene Polymer]

In a three-neck flask, 0.03 g of 3,4-ethylenedioxythiophene and 2.05 g of 3-methoxythiophene are added, and 0.1 L of acetonitrile is added to dissolve the thiophenes in acetonitrile. Next, the inside of the three-neck flask is substituted by nitrogen and cooled to 0° C. Next, a solution prepared by dissolving 20 g of iron(III) perchlorate n-hydrate [reagent grade] in 0.1 L of acetonitrile is added dropwise while the solution and the inside of the reaction system are maintained at 5° C. or less. Next, the temperature is increased to room temperature, and then the resultant mixture is stirred at room temperature for 15 hours. Next, 0.2 L of methanol is added and stirred for 1 hour. Next, a solid content is collected by solid-liquid separation using a centrifugal separator.

[Precipitate Treatment and Methanol Washing]

The collected solid content is dissolved in 100 mL of dimethylformamide. Then, 1 L of isopropyl alcohol is added dropwise to the resultant solution under stirring over 30 minutes, gradually precipitating a solid. Next, the solid content obtained by solid-liquid separation using a centrifugal separator is placed in a beaker, and 50 mL of methanol is added. Then, the liquid temperature is adjusted to 45° C., followed by stirring for 1 hour. Next, a solid content is collected by solid-liquid separation using a centrifugal separator, and then dried under reduced pressure at 60° C. for 16 hours, producing 1.9 g of thiophene polymer. The weight-average molecular weight of the thiophene polymer after methanol washing is 3,100.

[Preparation of Liquid Composition]

First, 100 mg of the thiophene polymer after methanol washing and 100 mg of ethoxylated bisphenol A diacrylate (product name ABE-300, manufactured by Shin-Nakamura Chemical Co., Ltd.) are dissolved in 10 mL of γ-butyrolactone. Then, 20 mg of thermal radical generator (product name AIBN, manufactured by Otsuka Chemical Co., Ltd., 10-hour half-life temperature: 65° C.) is dissolved in the resultant solution, and the resultant solution is filtered with a membrane filter of 0.45 μm. The filtrate is bubbled with Ar for 30 minutes to remove oxygen, producing a liquid composition.

[Formation of Metallic Luster Film]

The liquid composition is dropped and cast on a washed glass substrate to form a coating film. The glass substrate having the coating film is placed at room temperature for 10 minutes and then placed in a glass-made sealed vessel. The inside of the sealed vessel substituted by dry Ar until the oxygen concentration in the sealed vessel is 100 ppm. Then, the glass substrate is placed at a temperature of 45° C. for 20 minutes and at a temperature of 100° C. for 20 minutes. Thus, the coating film is cured to form a metallic luster film. The thickness of the metallic luster film is about 1.0 μm.

[Formation of Metallic Luster Reference Film]

First, 100 mg of the thiophene polymer after methanol washing is dissolved in 10 mL of γ-butyrolactone. Then, the resultant solution is filtered with a membrane filter of 0.45 μm, producing a thiophene polymer solution. The thiophene polymer solution is dropped and cast on a washed glass substrate to form a coating film. The glass substrate having the coating film is placed at room temperature for 10 minutes and then placed at a temperature of 45° C. for 20 minutes and at a temperature of 100° C. for 20 minutes. Thus, a metallic luster reference film is formed. The thickness of the metallic luster reference film is about 1.0 μm.

<Performance Evaluation>
[Luster of Metallic Luster Film]

The regular reflectance (%) of each of the metallic luster film and the metallic luster reference film is measured by irradiation with light at a wavelength of 600 nm using ultraviolet-visible spectrophotometer UV-2600 (manufactured by Shimadzu Corporation). Also, the color tone of each of the metallic luster film and the metallic luster reference film is observed with the naked eye under a fluorescent lamp of about 500 Lux. The luster is classified based on the regular reflectance and color tone as described below. The results are shown in Table 1.

A: A difference in regular reflectance between the metallic luster film and the metallic luster reference film is 5% or less, and the metallic luster film and the metallic luster reference film have the same color tone.

B: A difference in regular reflectance between the metallic luster film and the metallic luster reference film is over 5% and 10% or less, and the metallic luster film and the metallic luster reference film have the same color tone.

C: A difference in regular reflectance between the metallic luster film and the metallic luster reference film is over 5% or 10% or less, and the metallic luster film has a slightly blackish color tone (durable for practical use).

D: A difference in regular reflectance between the metallic luster film and the metallic luster reference film is over 10%, and the metallic luster film and the metallic luster reference film are not regarded as having the same color tone (not durable for practical use).

[Scratch Resistance of Metallic Luster Film]

The film strength of the metallic luster film is evaluated according to JIS K5600-5-4: 1999 "Scratch Hardness (pencil method)". The pencils used are Mitsubishi Pencil Hi-Uni (hardness: 10H, 9H, 8H, 7H, 6H, 5H, 4H, 3H, 2H, H, F, HB, B, 2B, 3B, 4B, 5B, 6B, 7B, 8B, 9B, and 10B). Table 1 shows the highest hardness which causes no scratch on the metallic luster film.

[Ink Jet Ejection Property of Liquid Composition]

Ink jet printer "EPSON PX-1004" is prepared, and an ejection head is washed with the solvent used in each of the examples or comparative examples. Then, the liquid composition of each of the examples and the comparative examples is injected into an ink cartridge. A straight line with 600 dpi is formed on plain paper by using the ink jet printer and the edge of the straight line is observed and classified as described below. The results are shown in Table 1.

A: Chipping is not observed at the edge of the line even by observation with a magnifying glass at a magnification of 100 times.

B: Chipping is not observed at the edge of the line by observation with the naked eye, but chipping is observed at the edge of the line by observation with a magnifying glass at a magnification of 100 times. The frequency of chipping observed with the magnifying glass is 1 to 5 positions per cm of length with no problem in practical use.

C: Chipping is observed at the edge of the line by observation with the naked eye. The frequency of chipping observed with the naked eye is 1 to 5 positions per cm of length.

D: Chipping is observed at the edge of the line by observation with the naked eye. The frequency of chipping observed with the naked eye is 6 or more positions per cm of length.

F: Ejection is impossible.

TABLE 1

| | Liquid composition | | | | | Performance evaluation | | |
| --- | --- | --- | --- | --- | --- | --- | --- | --- |
| | Thiophene polymer | | | | | | Scratch resistance | |
| | Type | Weight-average molecular weight | Polymerization component Type | Polymerization initiator Type | Solvent Type | Luster of metallic luster film | (pencil hardness) of metallic luster film | Ink jet ejection property of liquid composition |
| Comparative Example 1 | Poly(methoxythiophene) | 3000 | — | — | γ-Butyrolactone | A | 6B | A |
| Comparative Example 2 | Poly(methoxythiophene) | 3000 | Polyester resin | — | γ-Butyrolactone | B | H | F |
| Example 1 | Poly(methoxythiophene) | 3000 | Ethoxylated bisphenol A diacrylate | Thermal radical generator | γ-Butyrolactone | A | 4H | A |
| Example 2 | Poly(methoxythiophene) | 150 | Ethoxylated bisphenol A diacrylate | Thermal radical generator | γ-Butyrolactone | C | 2H | A |
| Example 3 | Poly(methoxythiophene) | 200 | Ethoxylated bisphenol A diacrylate | Thermal radical generator | γ-Butyrolactone | B | 3H | A |
| Example 4 | Poly(methoxythiophene) | 1000 | Ethoxylated bisphenol A diacrylate | Thermal radical generator | γ-Butyrolactone | A | 4H | A |
| Example 5 | Poly(methoxythiophene) | 10000 | Ethoxylated bisphenol A diacrylate | Thermal radical generator | γ-Butyrolactone | A | 4H | A |
| Example 6 | Poly(methoxythiophene) | 30000 | Ethoxylated bisphenol A diacrylate | Thermal radical generator | γ-Butyrolactone | A | 4H | B |
| Example 7 | Poly(methoxythiophene) | 31000 | Ethoxylated bisphenol A diacrylate | Thermal radical generator | γ-Butyrolactone | B | 4H | C |

TABLE 1-continued

| | Liquid composition | | | | | Performance evaluation | | |
|---|---|---|---|---|---|---|---|---|
| | Thiophene polymer | | | | | | Scratch resistance | |
| | Type | Weight-average molecular weight | Polymerization component Type | Polymerization initiator Type | Solvent Type | Luster of metallic luster film | (pencil hardness) of metallic luster film | Ink jet ejection property of liquid composition |
| Example 8 | Poly(methoxythiophene) | 3000 | Polyethylene glycol diacrylate, Trifunctional urethane acrylate oligomer | Optical radical generator | γ-Butyrolactone | A | 4H | A |
| Example 9 | Poly(methoxythiophene) | 3000 | Polyethylene glycol diacrylate, Ethoxylated bisphenol A diacrylate | Thermal radical generator | γ-Butyrolactone | A | 4H | A |
| Example 10 | Poly(methoxythiophene) | 3000 | Ethoxylated bisphenol A diacrylate | Thermal radical generator | Propylene carbonate | A | 5H | A |
| Example 11 | Poly(methoxythiophene) | 3000 | Ethoxylated bisphenol A diacrylate | Thermal radical generator | Mixed solvent at γ-butyrolactone/acetonitrile = 1/1 | A | 4H | B |
| Example 12 | Poly(butoxythiophene) | 3200 | Ethoxylated bisphenol A diacrylate | Thermal radical generator | γ-Butyrolactone | B | 4H | A |
| Example 13 | Poly(methylthiophene) (methoxythiophene) | 3300 | Ethoxylated bisphenol A diacrylate | Thermal radical generator | γ-Butyrolactone | A | 4H | A |
| Example 14 | Poly (ethylenedioxythiophene) (methoxythiophene) | 3100 | Ethoxylated bisphenol A diacrylate | Thermal radical generator | γ-Butyrolactone | A | 4H | A |

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A liquid composition comprising:
a thiophene polymer represented by the following general formula:

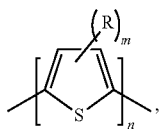

wherein:
R is a substituent selected from the group consisting of an alkoxy group, an alkyl group, an amino group, a hydroxyl group, a hydroxyalkyl group, an aryl group, an allyl group, a cyano group, and a halogeno group, m is 1, and
n is an integer of 2 or more;
at least one polymerization component selected from the group consisting of a monomer and an oligomer; and
a polymerization initiator comprising at least one selected from the group consisting of a thermal radical generator and an optical radical generator,
wherein:
the polymerization component comprises a monofunctional or difunctional (meth)acrylate that contains a chain-polymerizable polymerization component, and
an amount of the polymerization initiator relative to a total solid content of the liquid composition is 2% by mass or more and 8% by mass or less.

2. The liquid composition according to claim 1, further comprising an aprotic polar solvent.

3. The liquid composition according to claim 2, wherein the aprotic polar solvent contains at least one selected from the group consisting of acetonitrile, nitromethane, γ-butyrolactone, propylene carbonate, N-methylpyrrolidone, dimethylformamide, and dimethylsulfoxide.

4. The liquid composition according to claim 1, wherein the weight-average molecular weight of the thiophene polymer is 200 or more and 30000 or less.

5. The liquid composition according to claim 4, wherein the weight-average molecular weight of the thiophene polymer is 500 or more and 20000 or less.

6. The liquid composition according to claim 1, wherein the thiophene polymer contains a polymer produced by polymerization of at least one selected from the group consisting of alkoxythiophene, alkylthiophene, aminothiophene, and hydroxythiophene.

7. The liquid composition according to claim 6, wherein the thiophene polymer contains a polymer produced by polymerization of at least alkoxythiophene, and the alkoxythiophene contains alkoxythiophene having an alkoxy group having 1 or more and 8 or less carbon atoms.

8. The liquid composition according to claim 6, wherein the thiophene polymer contains a polymer produced by polymerization of at least alkylthiophene, and the alkylthiophene contains alkylthiophene having an alkyl group having 1 or more and 8 or less carbon atoms.

9. A metallic luster film comprising the liquid composition according to claim 1, which is cured.

10. An article comprising the metallic luster film according to claim 9.

* * * * *